United States Patent [19]

Kiyono et al.

[11] 4,146,853

[45] Mar. 27, 1979

[54] VARIABLE ATTENUATOR

[75] Inventors: Tetsuhiro Kiyono; Moritoshi Nakamura, both of Toda, Japan

[73] Assignee: Alps Electric Co., Ltd., Japan

[21] Appl. No.: 751,360

[22] Filed: Dec. 16, 1976

[30] Foreign Application Priority Data

Jan. 28, 1976 [JP] Japan ................. 51-8244[U]
Feb. 5, 1976 [JP] Japan ................. 51-11577

[51] Int. Cl.² .......................................... H03H 7/26
[52] U.S. Cl. ............................ 333/81 R; 338/128; 338/138; 338/174
[58] Field of Search ............... 179/1 VL; 323/74, 79, 323/96; 333/81 R, 81 A; 338/120, 123, 125, 127, 138, 142, 160, 162, 176, 185, 217, 126, 128, 140, 155, 174

[56] References Cited

U.S. PATENT DOCUMENTS

| | | | |
|---|---|---|---|
| 2,517,180 | 8/1950 | Davis | 333/81 R X |
| 2,536,501 | 1/1951 | Hood et al. | 333/81 R |
| 3,341,790 | 9/1967 | Candilis | 333/81 R |
| 3,740,676 | 6/1973 | Garuts | 333/81 A |
| 3,824,506 | 7/1974 | Bacher | 333/81 A |
| 4,035,747 | 7/1977 | Hindermayr et al. | 338/176 X |

FOREIGN PATENT DOCUMENTS 804747 11/1958 United Kingdom ............. 333/81 R

*Primary Examiner*—Paul L. Gensler
*Attorney, Agent, or Firm*—Guy W. Shoup; Gerard F. Dunne

[57] ABSTRACT

A main resistance element and an elongated conductor are arranged coaxially and a plurality of secondary resistance elements are arranged radially and connected between the main resistance element and the conductor. A slider is ohmically movable on the main resistance element to provide a variable attenuator with low impedance and logarithmic attenuation to at least −60 db. An auxiliary resistance element may be provided coaxially with the main resistance element and the conductor with another set of secondary resistance elements connecting the auxiliary resistance element with the conductor, the ends of the main and auxiliary resistance elements being connected together.

13 Claims, 9 Drawing Figures

VARIABLE ATTENUATOR

BACKGROUND OF THE INVENTION

The present invention relates to a variable attenuator for use as a volume control in a sound reproduction system or the like which provides low impedance and high attenuation.

Variable attenuators of the type to which the present invention is an improvement are used in sound reproduction systems and the like as volume controls. Due to the audio response characteristics of the human ear, the variable attenuator is designed to provide a logarithmic attenuation curve with respect to the position of the control member. It has heretofore been unknown in the art to provide a variable attenuator with low impedance and attenuation greater than −20db to −40db without a complicated and expensive configuration.

One method of constructing a variable attenuator with a maximum attenuation approaching −60db is to increase the impedance, thereby creating problems in matching the variable attenuator to the other components of the sound system. Another method involves the use of two or more variable resistors ganged together. However, the noise generated by the sliders of the variable resistors and the inaccuracy in tracking between the two variable resistors due to manufacturing tolerances make this method unsatisfactory.

It is also known to fabricate the resistance element of a variable attenuator in a series of overlapping layers of different resistivity or specific resistance. The generation of noise in such a configuration due to the movement of the slider over the interfaces of the layers in addition to the manufacturing cost and inaccuracy due to manufacturing tolerance in fabricating the layers of different resistivity render this method less than satisfactory.

Still another expedient has been to provide compensating resistors of different resistivity outboard of a main resistance element. The same drawbacks of high manufacturing cost and inaccuracy also limit the desirability of this system.

SUMMARY OF THE INVENTION

It is an object of the present invention to provide a variable attenuator which overcomes the drawbacks of the prior art and is simple and inexpensive to manufacture on a commercial production basis.

It is another object of the present invention to provide a variable attenuator with low impedance and attenuation in excess of −60db.

It is another object of the present invention to provide a variable attenuator which comprises a main resistance element with which a slider ohmically engages, a conductor extending parallel to the main resistance element and a plurality of secondary resistance elements connected between the main resistance element and the conductor and spaced from each other at predetermined intervals.

Other objects, together with the foregoing, are attained in the embodiments described in the following description and illustrated in the accompanying drawings.

DESCRIPTION OF THE PREFERRED EMBODIMENTS

While the variable attenuator of the invention is susceptible of numerous physical embodiments, depending upon the environment and requirements of use, substantial numbers of the herein shown and described embodiments have been made, tested and used, and all have performed in an eminently satisfactory manner.

Figure 1:
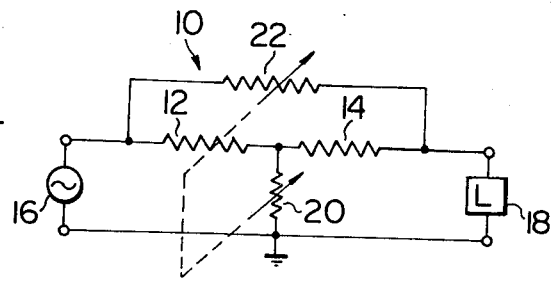
FIG. 1 is an electrical schematic diagram of a prior art variable attenuator.

FIG. 1 of the drawing shows a prior art variable attenuator 10 of the T-pad type, which comprises fixed resistors 12 and 14 connected in series with a signal source 16 and an output load 18. A first variable resistor 20 is connected between the junction of the fixed resistors 12 and 14 and ground. A second variable resistor 22 is connected in parallel with the series combination of the fixed resistors 12 and 14. The sliders of the variable resistors 20 and 22 are ganged together. Typical values of the resistance ranges of the variable resistors 20 and 22 are zero to 5 kilo-ohms and infinity to 10 kilo-ohms respectively. The major drawbacks of the attenuator 10 are tracking errors between the variable resistors 20 and 22 and the noise generated by the two sliders.

Figure 2:
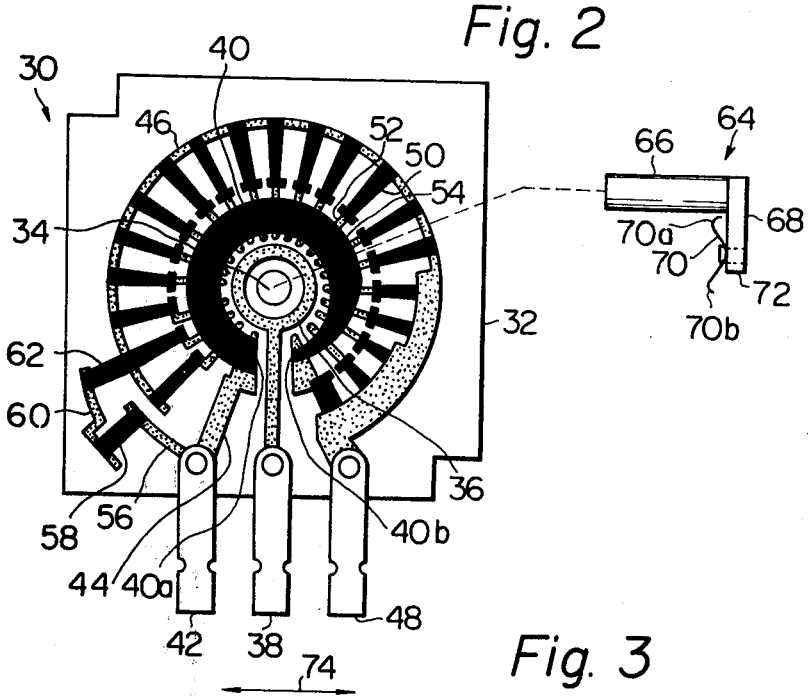
FIG. 2 is a partially exploded pictorial view of a first embodiment of a variable attenuator according to the present invention.

Referring now to FIG. 2, a variable attenuator 30 embodying the present invention comprises an insulating base plate 32 formed with a central hole 34. An annular conductor 36 coaxially surrounds the hole 34 and is connected to a terminal 38. A main resistance element 40 is formed coaxially around the conductor 36, the thickness of which decreases in the clockwise direction from a first end 40a to a second end 40b thereof. A terminal 42 is connected to the end 40a of the main resistance element 40 by a conductor 44. An elongated conductor 46 coaxially surrounds the main resistance element 40 and is connected to a terminal 48. Secondary resistance elements 50 extend radially inwardly from the conductor 46 and are connected to the main resistance element 40 by connector conductors 52. In FIG. 2, only one each of the secondary resistance elements 50 and conductors 52 are designated by reference numerals for simplicity of illustration, although the actual numbers of secondary resistance elements 50 and conductors 52 shown in FIG. 2 are 20 each. In a similar manner, the portions of the main resistance element 40 between adjacent conductors 52 are collectively designated as 54. The terminal 42 is further connected to the conductor 46 through the series arrangement of a conductor 56, a resistance element 58, a conductor 60 and a resistance element 62.

The resistivity of the main resistance element 40 is uniform and the resistivity of all of the resistance elements 50 is the same, with the resistivity of the elements 50 being equal to or greater than that of the main resistance element 40. In the particular embodiment shown in FIG. 2, the thickness of the resistance elements 50 increases and the length thereof decreases from the end 40a to the end 40b of the main resistance element 40, so that the resistance values of the resistance elements 50 progressively decrease. The angular spacing between the resistance elements 50 is shown as being equal, although it may be made unequal to provide a desired attenuation curve. All of the resistance elements shown and described with reference to FIG. 2 are preferably formed on the base plate 32 by a printing technique.

Shown as detached from the base plate 32 is a slider 64 comprising a shaft 66 arranged to rotatably protrude through the hole 34. An arm 68 is fixed to the shaft 66 and a flexible contact 70 is fixed to the arm 68 by a rivet 72. The contact 70 has a first engaging portion 70a ohmically engaging with the conductor 36 and a second engaging portion 70b ohmically engaging with the main resistance element 40. By rotation of the slider 64, the terminal 38 is connected to various points on the main resistance element 40 through the contact 70.

The attenuator 30 is utilized by connecting a signal source 76 between the terminals 42 and 48 and connecting an output load 78 between the terminals 38 and 48.

Figure 3:
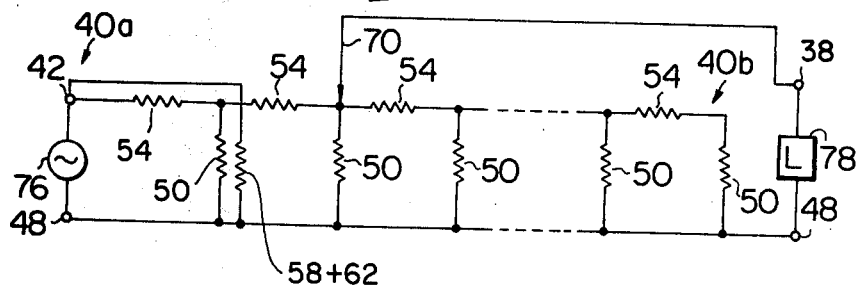
FIG. 3 is an electrical schematic diagram illustrating the equivalent circuit of the variable attenuator shown in FIG. 2.
Figure 4:
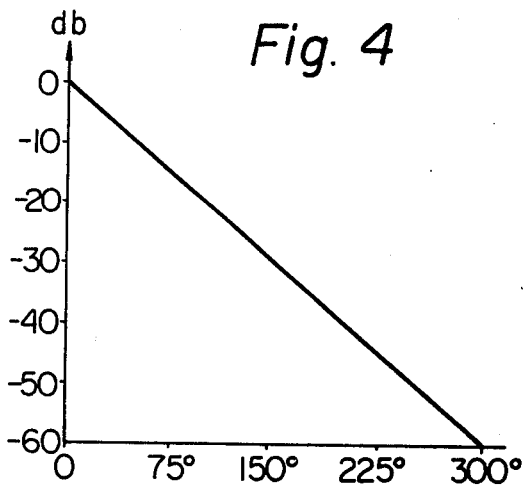
FIG. 4 is a graph illustrating the attenuation curve of the variable attenuator shown in FIG. 2.

FIG. 3 shows an equivalent circuit diagram of the attenuator 30 and FIG. 4 shows the attenuation curve thereof, with the abcissa in FIG. 4 representing the angular position of the contact 70 measured from the end 40a of the main resistance element 40 and the ordinate representing the attenuation provided by the attenuator 30. The attenuation is linear as measured in decibels and logarithmic as measured in voltage or power. An arrow 74 in FIG. 3 indicates the direction of movement of the contact 70 on the main resistance element 40. The attenuator 30 provides a step-ladder type attenuation characteristic although the curve of FIG. 4 is shown as smooth for simplicity of illustration. A desired attenuation curve may be provided by suitably specifying the length and thickness of the resistance elements 50, the spacing therebetween and the shape of the main resistance element 40. The attenuator 30 provides attenuation of at least −60db with low impedance in practical application. The noise is considerably reduced over the prior art attenuator 10 since the attenuator 30 comprises only one slider whereas the attenuator 10 comprises two sliders.

Figure 5:
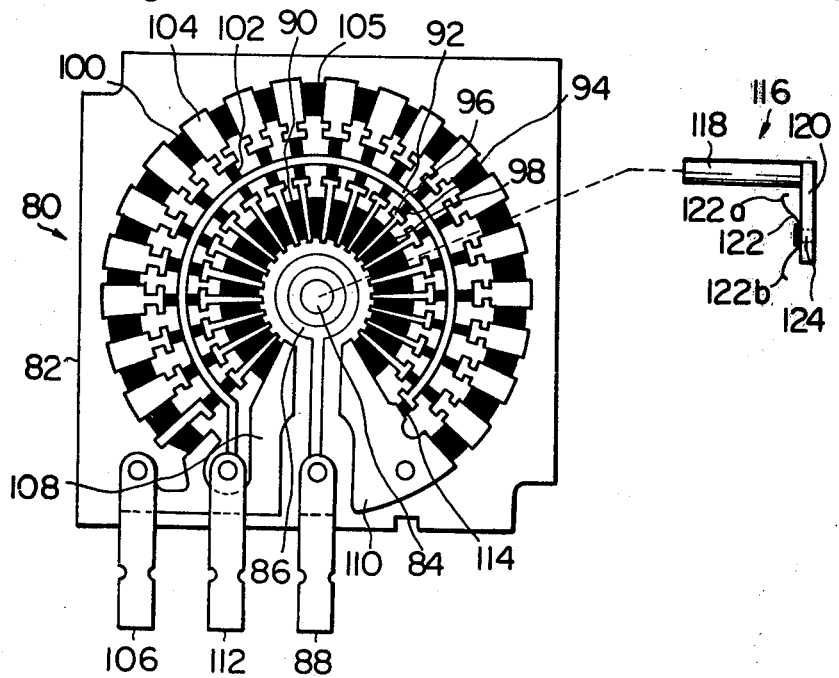
FIG. 5 is a partially exploded pictorial view of a second embodiment of a variable attenuator according to the present invention.

A second embodiment of the present invention is shown in FIG. 5. A variable attenuator 80 comprises an insulating base plate 82 and is formed with a central hole 84. An annular conductor 86 is formed coaxially around the central hole 84 and is connected to a terminal 88. A main resistance element 90 is formed coaxially around the conductor 86 and a conductor 92 is formed coaxially around the main resistance element 90. Secondary resistance elements 94 extend radially inwardly from the conductor 92 and are connected to the main resistance element 90 through connector conductors 96. The secondary resistance elements 94 are shown as spaced at equal angular intervals and the portions of the main resistance element 90 between the connector conductors 96 are designated as 98.

Coaxially surrounding the conductor 92 is an auxiliary resistance element 100. Extending radially outwardly from the conductor 92 at the connection points of the secondary resistance elements 94 are auxiliary secondary resistance elements 102 which are connected to the auxiliary resistance element 100 through auxiliary connector conductors 104. The portions of the resistance element 100 between the conductors 104 are collectively designated as 105. A terminal 106 is connected to first ends (not designated) of the resistance elements 90 and 100 respectively, and second ends (not designated) of the resistance elements 90 and 100 which are spaced in the clockwise direction from the first ends respectively are bridged by a conductor 110.

One end of the conductor 92 is connected to a terminal 112 whereas the other end thereof is connected to the condctor 110 through a resistance element 114.

A slider 116 comprises a shaft 118 rotatable in the hole 84 and an arm 120 fixed to the shaft 118. A contact 122 is fixed to the arm 120 by a rivet 124 and has an engaging portion 122a which ohmically engages with the conductor 86 and an engaging portion 122b which ohmically engages with the main resistance element 90. The slider 116 thereby serves to connect the terminal 122 with various points on the main resistance element 90.

Figure 6:
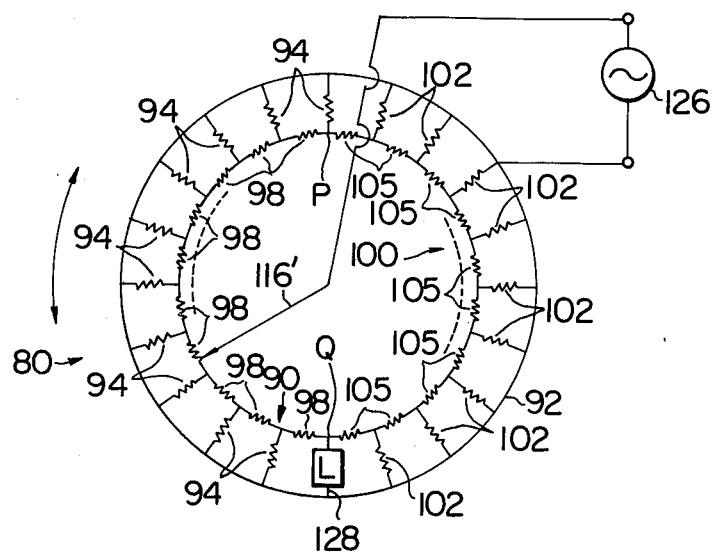
FIG. 6 is an electrical schematic diagram illustrating the equivalent circuit of the variable attenuator shown in FIG. 5.
Figure 7:
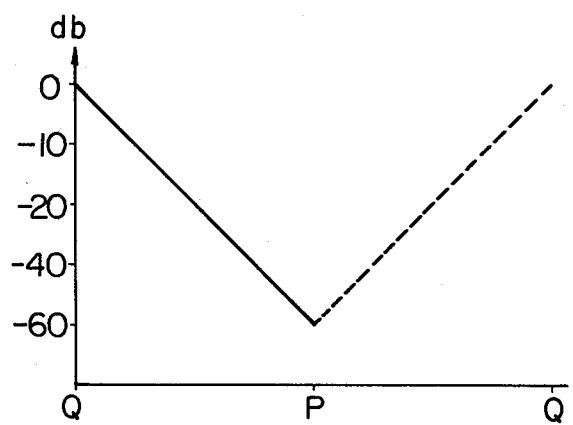
FIG. 7 is a graph illustrating the attenuation curve of the equivalent circuit shown in FIG. 6.

The attenuator 80 is utilized by connecting a signal source 126 between the terminals 88 and 112 and an output load 128 between the terminals 106 and 112. A symbolic equivalent circuit of the attenuator 80 is shown in FIG. 6 and an attenuation curve is shown in FIG. 7. The resistance element 114 is omitted in FIG. 6 for simplicity of illustration. The resistance values of the resistance elements 94 and 102 are selected to be equal to each other and also equal to that of the load 128. In this manner, the impedance of the attenuator 80 is the same regardless of the position of the slider 116 and is perfectly matched to the load 128. Positions Q and P in FIGS. 6 and 7 indicate that the engaging portion 122b of the slider 116 is in engagement with the ends of the main resistance element 90 connected to the conductors 108 and 110 respectively. It will be seen from FIG. 7 that clockwise rotation of the slider 116 produces an attenuation curve which even steeper than that of the attenuator 30 as shown by the solid line curve. The phantom line curve in FIG. 7 indicates the attenuation which would result if the slider 116 were adapted to engage with the resistance element 100 rather than the resistance element 90.

Figure 8:
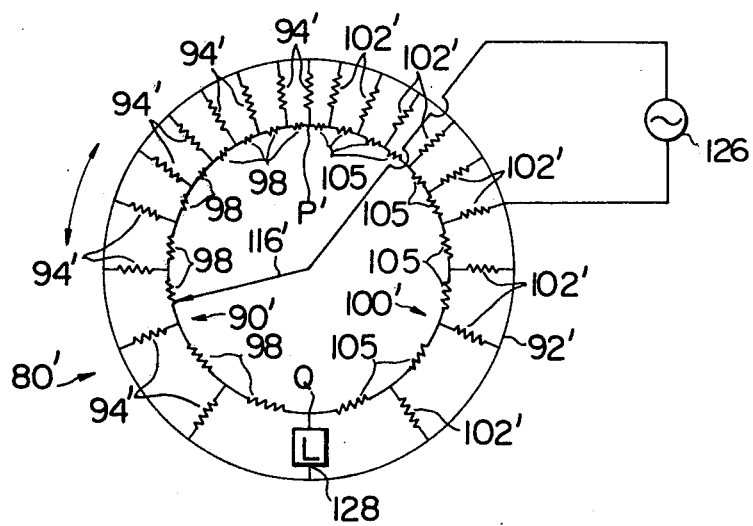
FIG. 8 is an electrical schematic diagram illustrating a modified equivalent circuit of the variable attenuator shown in FIG. 5.
Figure 9:
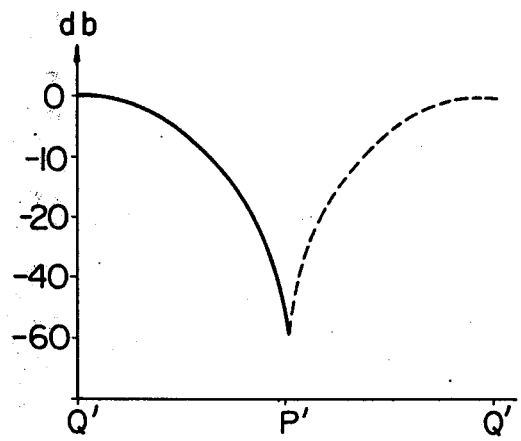
FIG. 9 is a graph illustrating the attenuation curve of the modified equivalent circuit shown in FIG. 8.

FIGS. 8 and 9 illustrate a modification of the attenuator 80 designated as 80' in which the spacing between the secondary resistance elements 94' and 102' progressively decreases in the clockwise direction. Corresponding elements are designated by the same reference numerals used in FIG. 6 suffixed by an apostrophe. This particular configuration provides a non-logarithmic attenuation curve which is shown in FIG. 9 to illustrate the flexibility in design afforded by the present invention.

Many modifications are possible for those skilled in the art within the scope of the present disclosure. The attenuation of the attenuator 80 can be increased well beyond −60db if desired by increasing the number of secondary resistance elements 94 and 102 and decreasing the spacing therebetween. Although the present invention has been shown and described as embodied by a rotary attenuator, the resistance elements and conductors may be provided in a linear parallel configuration if desired.

What is claimed is:

1. A variable attenuator comprising:
   an elongate main resistance element;
   an elongate conductor extending parallel to said main resistance element;
   a plurality of secondary resistance elements connected to said elongate conductor and spaced from each other at predetermined intervals;
   a plurality of connector conductors each connected between said main resistance element and a respective secondary resistance element, said connector conductors each having a width narrower than that of the respective secondary resistance element connected thereto;
   a slider ohmically contacting said main resistance element;
   a first terminal connected electrically to an end portion of said main resistance element;
   a second terminal connected electrically to the other end portion of said main resistance element; and
   a third terminal connected electrically to said slider.

2. A variable attenuator as in claim 1, in which said main resistance element and said secondary resistance elements have the same resistivity.

3. A variable attenuator as in claim 1, in which secondary resistance elements are progressively thicker from one end toward an opposite end of said main resistance element.

4. A variable attenuator as in claim 1, in which the secondary resistance elements each have the same resistivity and are progressively thicker from one end toward and opposite end of the main resistance element.

5. A variable attenuator as in claim 4, in which the secondary resistance elements are progressively shorter from said one end toward said opposite end of the main resistance element.

6. A variable attenuator comprising:
   an elongate main resistance element;
   an elongate conductor extending parallel to said main resistance element;
   a plurality of secondary resistance elements connected between said main resistance element and said elongate conductor and spaced from each other at predetermined intervals;
   a slider ohmically contacting said main resistance element;
   an auxiliary resistance element extending parallel to said elongate conductor; and
   a plurality of secondary auxiliary resistance elements connected between said auxiliary resistance element and said elongate conductor and spaced from each other at predetermined intervals.

7. A variable attenuator as in claim 6, further comprising a plurality of auxiliary connector conductors connected between the auxiliary resistance element and the auxiliary secondary resistance elements respectively.

8. A variable attenuator as in claim 6, in which the main and auxiliary resistance elements each have a first end and a second end, the first end of the main resistance element being connected to the first end of the auxiliary resistance element and the second end of the main resistance element being connected to the second end of the auxiliary resistance element.

9. A variable attenuator as in claim 8, in which one end of said elongate conductor is connected to the first ends of the main and auxiliary resistance elements respectively.

10. A variable attenuator as in claim 9, in which the main and auxiliary resistance elements and said elongate conductor are coaxially arranged with the conductor between the main and auxiliary resistance elements.

11. A variable attenuator as in claim 9, in which the secondary and auxiliary secondary resistance elements are angularly spaced from each other by the same predetermined intervals.

12. A variable attenuator as in claim 11, in which said predetermined intervals are all equal.

13. A variable attenuator as in claim 11, in which said predetermined intervals progressively decrease.

* * * * *